United States Patent
Frazzitta

Patent Number: 6,058,839
Date of Patent: May 9, 2000

[54] COMPUTERIZED CUTTING METHOD AND APPARATUS FOR USE IN PRINTING OPERATIONS

[76] Inventor: Joseph R. Frazzitta, 279 Cherry Pl., East Meadow, N.Y. 11554

[21] Appl. No.: 09/189,828

[22] Filed: Nov. 10, 1998

[51] Int. Cl.[7] .............................. B41N 1/12; B41F 27/00
[52] U.S. Cl. .................... 101/401.1; 101/492; 101/382.1
[58] Field of Search ............................ 101/401.1, 382.1, 101/492, 486

[56] References Cited

U.S. PATENT DOCUMENTS

| | | |
|---|---|---|
| 3,636,251 | 1/1972 | Daly et al. . |
| 3,832,948 | 9/1974 | Barker . |
| 4,181,077 | 1/1980 | Dalton . |
| 4,395,946 | 8/1983 | Price . |
| 4,403,548 | 9/1983 | Faller . |
| 4,475,455 | 10/1984 | Mitter . |
| 4,526,098 | 7/1985 | Bachman . |
| 4,589,339 | 5/1986 | Fischer . |
| 4,767,694 | 8/1988 | Schubert . |
| 4,912,824 | 4/1990 | Baran . |
| 5,072,671 | 12/1991 | Schneider et al. . |
| 5,126,531 | 6/1992 | Majima et al. . |
| 5,148,746 | 9/1992 | Fuller et al. . |
| 5,182,990 | 2/1993 | Kline et al. . |
| 5,214,990 | 6/1993 | Ben-David et al. . |
| 5,247,883 | 9/1993 | Kuwahara et al. . |
| 5,249,525 | 10/1993 | Lewis et al. . |
| 5,259,311 | 11/1993 | McCaughey et al. . |
| 5,278,027 | 1/1994 | Clarke . |
| 5,337,668 | 8/1994 | Matsuoka et al. . |
| 5,370,052 | 12/1994 | Reslow . |
| 5,392,711 | 2/1995 | Kainuma . |
| 5,427,026 | 6/1995 | Kuwahara ............................ 101/401.1 |
| 5,446,987 | 9/1995 | Lee et al. . |
| 5,493,971 | 2/1996 | Lewis et al. . |
| 5,511,479 | 4/1996 | Rogovein et al. ................... 101/401.1 |
| 5,544,584 | 8/1996 | Thompson et al. . |
| 5,551,341 | 9/1996 | Lewis et al. . |
| 5,566,618 | 10/1996 | Frazzitta ............................... 101/401.1 |
| 5,715,750 | 2/1998 | Goovaard ............................. 101/401.1 |
| 5,868,075 | 2/1999 | Kline et al. ........................... 101/401.1 |

*Primary Examiner*—Eugene Eickholt
*Attorney, Agent, or Firm*—R. Neil Sudol; Henry D. Coleman

[57] ABSTRACT

In a printing method, an electrically encoded image to be transferred to a printing substrate during a printing process is provided in an electronic memory. A flexible carrier web is attached under tension to a cutting cylinder with an adjustable diameter. The cutting cylinder is adjusted to have a diameter which matches the diameter of a blanket or printing cylinder of a printing machine. The length of the cutting cylinder is at least as great as the length of the blanket or printing cylinder. The carrier web is cut automatically in accordance with the electrically encoded image after attachment of the carrier web to the adjusted cutting cylinder.

37 Claims, 3 Drawing Sheets

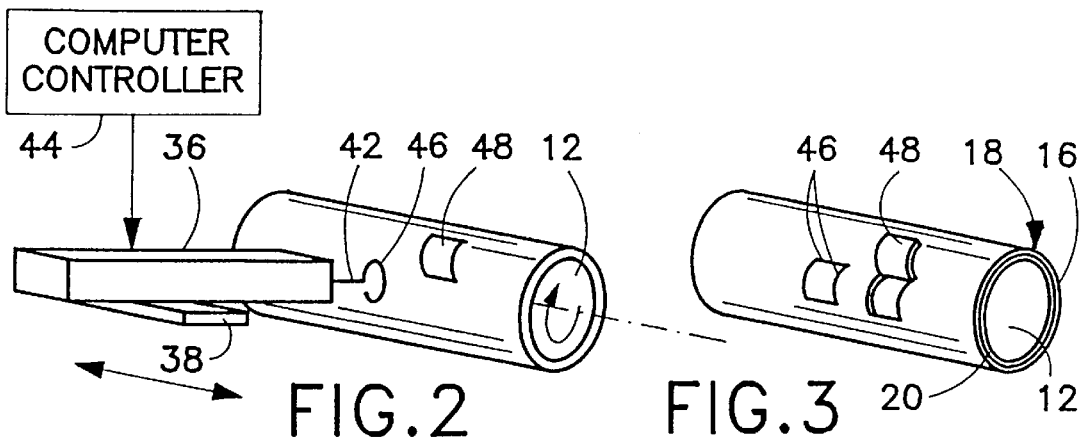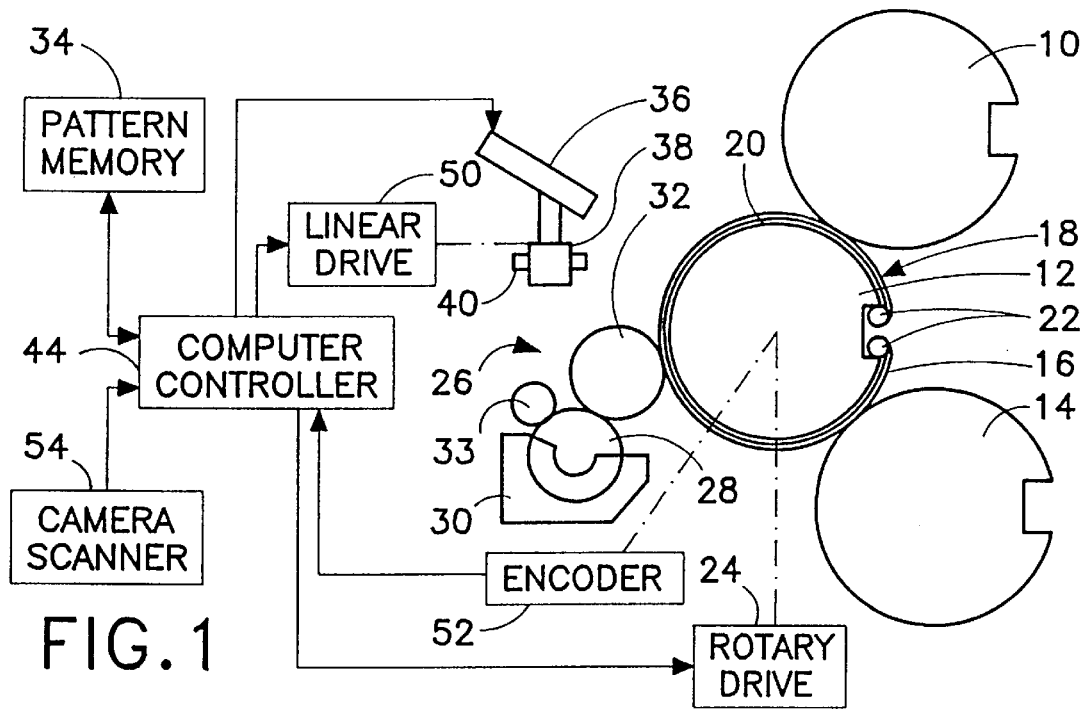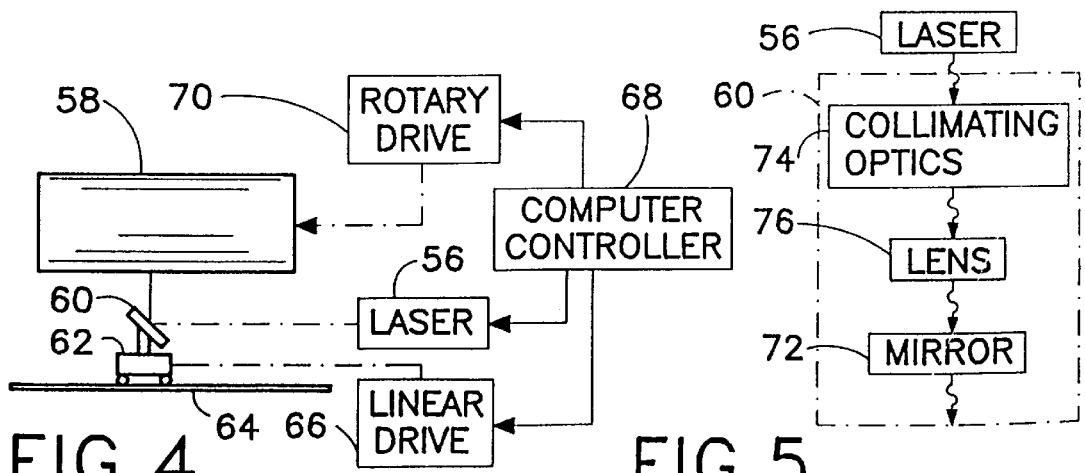

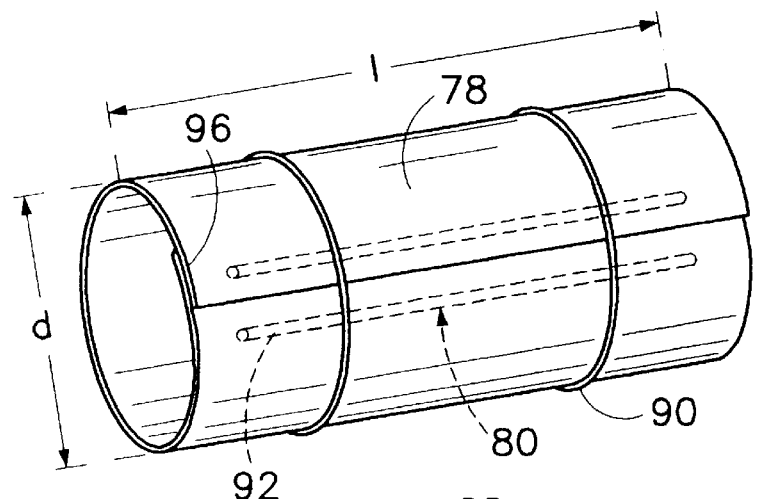
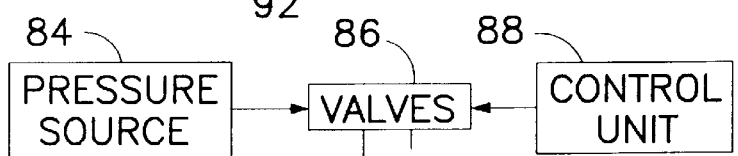
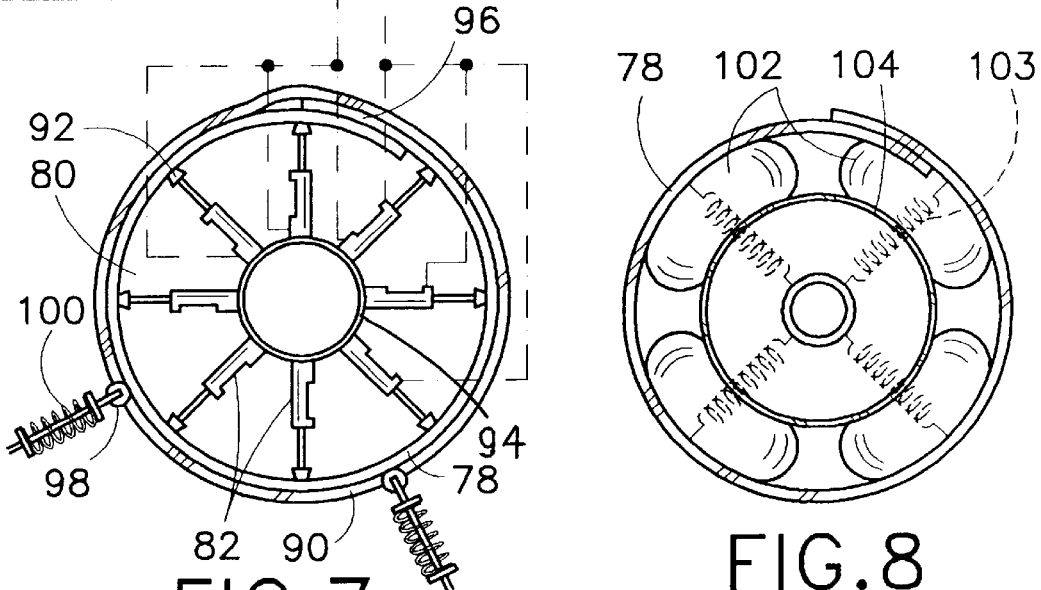
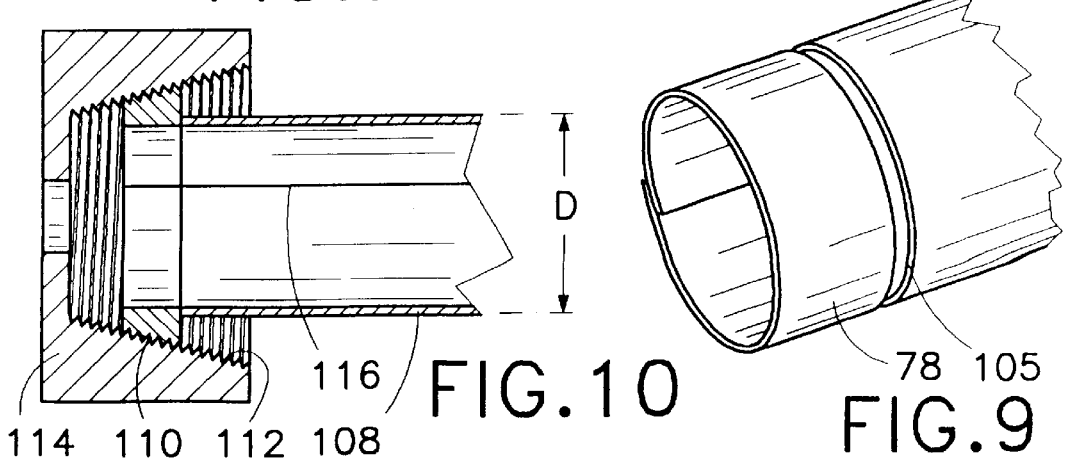

COMPUTERIZED CUTTING METHOD AND APPARATUS FOR USE IN PRINTING OPERATIONS

BACKGROUND OF THE INVENTION

This invention relates to a method for use in printing. This invention also relates to an associated apparatus. The method and apparatus are particularly effective in offset printing.

In offset printing, the matter to be reproduced is copied photographically onto a metal plate disposed on a cylinder of a printing press. The metal plate is then inked and rotated with the plate cylinder to make an imprint of the text or illustration on a rubber layer disposed on a so-called blanket cylinder. This blanket cylinder is in turn rotated to print on sheets of paper which are automatically fed to the machine. An impression cylinder serves as the back-pressure cylinder which squeezes the paper sheets to the blanket cylinder for transferring ink to the substrate for final reproduction. In addition, a coater apparatus is attached to a deck area of the printing press or integrated as part of the printing press. When a job requires coating, the coater apparatus is shifted into direct contact with the blanket cylinder while the plate cylinder is not operable to transfer ink images to the rubber surface. As an alternative to this arrangement, wherein the blanket cylinder is part of the printing unit and is used just for coating while the plate cylinder is not in service, the blanket cylinder can be part of an inline coating unit constructed independently of the printing unit to provide coating reproduction, inline, on an offset printing press.

The plate cylinder, the printing or blanket cylinder, and the impression cylinder are geared together to form a single printing unit. In multicolor presses, there are two or more printing units in tandem.

Each cylinder of the offset printing press has a gap area for allowing clearance of a delivery gripper chain system. When a reproduction of spot coating is required, the printer has several options: he may purchase a DuPont CYREL™ plate or a single, dual or multilayer printing blanket which is used in the offset process for transferring inked images, which is manufactured by Reeves International or Day International, Inc. The construction of the printing blanket can be either a compressible or a conventional design. The DuPont CYREL™ plate has a flexible photopolymer compound laminated in a layer to a polymeric carrier layer such as polyvinyl chloride or MYLAR™. A chemical developer is used to remove non-imaging, unexposed areas from the photopolymer compound layer of the plate. There follows a light exposure finishing procedure to harden the remaining polymer. After developing, the plate has two surface levels. A lower surface area is the non-image area, which does not receive a coating during a printing process, while a raised surface area receives a coating from the coating apparatus. The differential in height is referred to as the relief area. This relief area ranges from 10 to 30 thousandths of an inch for the CYREL™ system.

An offset printing blanket for providing a raised surface for spot coating reproduction is also commonly used by offset printers. The blanket has an upper rubber layer removably attached to an underlying, woven fabric layer. The printing blanket is attached to the blanket cylinder so that the fabric layer is disposed inside, in contact with the cylinder, while the rubber layer is outside. If the blanket is pre-installed around its cylinder, a manual or freehand cutting of the rubber layer is required. This manual or freehand cutting technique is time consuming and limited in practice to extremely simple patterns because of the difficulty in achieving accuracy.

Some printers cut the rubber layer of a printing blanket before installing it on the blanket cylinder of an offset printing press. This process is accomplished by using a multicutting plotter, for example, manufactured by Misomex, which provides accurate cuts over a wide range of complicated shapes and designs. The rubber blanket is cut in a flat orientation and subsequently attached to the blanket cylinder. Distortion introduced by the mounting tension requires special compensating steps, in order to reproduce the coating in the exact location of the printed design once the carrier material is wrapped around the blanket cylinder.

The distortion caused by mounting tension can vary considerably. The average tension is estimated to be about 50 lbs. per inch of width. Distortion will depend not only on the average applied tension but on a number of other factors including the thickness of the carrier material and the diameter of the blanket cylinder. Distortion may occur in both the circumferential direction and the axial direction.

Pre-installation compensation for distortion in a raised surface spot image carrier material entails extremely detailed calculations. Software or computer programs have been developed for predicting distortion and compensating for the predicted distortion by modifying cuts which would otherwise be made in the rubber layer of a printing blanket. Nevertheless, results in distortion compensating have been inconsistent and time consuming, in part because of the various types of spot coating carrier material and the many different types of printing presses and the tension factors for proper mounting. In brief, the chance for error when calibrating for distortion is significant.

OBJECTS OF THE INVENTION

An object of the present invention is to provide a method for forming a raised surface for transferring an ink or a coating composition in a predetermined pattern to a printing substrate during a printing process.

A more specific object of the present invention is to provide such a method which can be used in spot coating reproduction in offset printing.

Another specific object of the present invention is to provide such a method wherein the effects of distortions of the printing blanket or other carrier material (such as CYREL™) owing to attachment tension are reduced, if not eliminated.

A further object of the present invention is to provide an apparatus for carrying out the methodology of the invention.

These and other objects of the present invention will be apparent from the drawings and detailed descriptions herein.

SUMMARY OF THE INVENTION

A method used in printing in accordance with the present invention utilizes an electrically encoded image stored in an electronic memory, for transference to a printing substrate during a printing process. A flexible carrier web or sheet is attached under tension to a cutting cylinder which has an adjustable diameter. Prior to attachment of the carrier web or sheet, the diameter of the cutting cylinder is adjusted to equal the diameter of a blanket or printing cylinder of a printing machine. The carrier web is then automatically cut in accordance with the electrically encoded image. Sections of the carrier web may be removed along cut lines made in the carrier web during the cutting thereof. The cut carrier web is used on the blanket or printing cylinder of the printing machine to transfer an ink or coating composition to the printing substrate.

It is contemplated that the cutting of the carrier web is implemented on a dedicated cutting cylinder which is separate from the printing machine, in a stand-alone cutting assembly. Accordingly, the cut carrier web is detached from the cutting cylinder after the cutting of the carrier web and is then fastened to the blanket or printing cylinder of the printing machine under essentially the same tension that was applied to the carrier web on the cutting cylinder. After the fastening of the cut carrier web to the blanket or printing cylinder, the printing machine is operated to transfer ink or coating in a predetermined pattern (e.g., the stored image) to the printing substrate.

It is generally contemplated that the cutting of the carrier web is accomplished by automatically operating a cutting device which includes a cutter such as a knife of a laser. It is further contemplated that the cutting of the carrier web includes operating a computer to change a positioning of the cutting device relative to the carrier web, the computer being operatively connected to the memory. Also, the cutting of the carrier web includes operating the computer to change an angular positioning of the cutting cylinder (which is either separate or part of the printing press) alternately in opposite directions about a rotation axis. Where the cutting device includes a laser cutter, the operating of the cutting device includes operating the computer to control energization of the laser cutting device.

Where the carrier web is a dual-layer printing blanket, the cutting includes cutting essentially only an outer layer of the carrier web, the removed sections of the carrier web being of the outer layer.

In accordance with another feature of the present invention, the electrically encoded image is provided by scanning a pre-existing image, thereafter converting the pre-existing image into electrical signals, and storing the electrical signals. The scanning may be implemented optically.

In accordance with the invention, the cutting of the carrier web includes forming essentially only continuous curvilinear cuts in the carrier web. Moreover, the cut lines and outer edges of the carrier web essentially define only closed sections in the carrier web.

In accordance with a feature of the invention, a coating device is shifted into contact with raised portions of the carrier web after cutting of the carrier web on the printing cylinder or after fastening the cut carrier web to the printing cylinder. The coating device is operated to provide a spot coating image on the carrier web, a plate cylinder of the printing machine being inoperative to transfer ink images to the carrier web during the operation of the coating device to provide a spot coating on the carrier web.

The carrier web may be coupled to a metal plate via an adhesive layer and subsequently attached with the metal plate to the cutting cylinder. Where the cutting cylinder is disposed apart from the printing machine in a dedicated cutting assembly, the detaching of the cut carrier web from the cutting cylinder includes detaching the carrier web with the metal plate, while the fastening of the cut carrier web to the blanket or printing cylinder includes fastening the carrier web with the metal plate to the blanket or printing cylinder.

An apparatus used in printing comprises, in accordance with the invention, a memory for storing an electrically encoded image to be transferred to a printing substrate during a printing process, a cylinder rotatable in opposite directions about an axis, coupling elements on the cylinder for removably attaching a carrier web under tension to the cylinder, a cutting device for forming continuous curvilinear cuts in the carrier web attached to the cylinder, and a controller operatively connected to the memory and the cutting device for controlling the cutting device to form, in the carrier web in accordance with the electrically encoded image, continuous curvilinear cuts defining removable closed forms in the carrier web. The rotatable cylinder has elements for enabling an adjustment in the diameter of the cylinder. This enables adaptation of this cutting cylinder to printing or blanket cylinders of different dimensions. The cutting cylinder has a length which is as long or longer than the lengths of all known blanket or printing cylinders.

Preferably, the controller includes a computer programmed to control the cutting device to form continuous curvilinear cuts in the carrier web in accordance with the electrically encoded image. The cutting device further includes positioning components operatively for positioning the cutting relative to the cylinder, the computer being operatively connected to the positioning components for controlling the operation thereof. The cutting device further includes angular positioning components operatively coupled to the cylinder for rotating same during a cutting operation, the computer being operatively connected to the angular positioning components for controlling an angular positioning of the cylinder. The positioning components may include a carriage mounted along a linear track extending axially relative to the blanket cylinder. The carriage supports cutting components and positions those components relative to the cutting cylinder. More particularly, the computer has output leads extending to a drive for moving the carriage back and forth along the track as the cutting cylinder slowly rotates alternately in opposite directions about its longitudinal axis.

Pursuant to a particular feature of the present invention, a scanner is connected to the memory, for example, via the computer, for scanning a pre-existing image and transmitting, to the memory, electrical signals encoding the pre-existing image. The scanner may include an optical scanner such as a video camera. The scanner inputs to the memory, via the computer, a digitized image corresponding to a graphical pattern embodied, for example, on a sheet of paper. Alternatively, the pattern or image to be reproduced on the printing blanket and transferred therefrom to the printing substrate may be produced via a graphics program and stored in memory. Where a video camera is used, a digitized signal produced by the camera or derived from the output thereof is processed by the computer to produce image information recorded in the memory.

It is to be noted that cutting of a carrier web in accordance with the present invention may be executed with a knife, a drill, a rotating or reciprocating saw, or any other equivalent cutting member. One or more micrometers may be provided for enabling an accurate adjustment in the depth of cutting where the cutting is performed, for instance, by a knife, drill or saw.

The carrier web may be made of any flexible sheet material capable of holding ink or coating compositions and transferring the ink or coating compositions to a printing substrate during a printing process. Accordingly, the term "carrier web" as used herein is meant to include individual sheets cut to cylinder size based on press manufacturer specifications. The carrier web may be a printing blanket in the form of a flexible single, dual or multilayer sheet such as manufactured by Day International or Reeves International. Alternatively, a single, dual or multilayer carrier web or printing blanket may be attached in part via an adhesive backing to a metal plate which is then mounted to the cutting cylinder. In the former case, only the upper or outer layer of the blanket sheet is cut and removed. In the latter case, the sheet is cut through to an underlying metal surface, e.g., of the metal plate which is mounted to the blanket or printing cylinder.

It is to be observed that the blanket or printing cylinder may be located at any position along an inline printing machine, whether for applying ink or clear coating to a printing substrate.

The present invention could additionally be used in forming continuous vertical or horizontal cuts. The vertical or horizontal cuts are generally done to delete the glue flaps in the printing and manufacturing of a folding box carton. This prevents the coating from reproducing in the glue flap area or the non-image relief area.

The carrier web or printing blanket is attached to the cutting cylinder and to the printing cylinder, if separate, via normal blanket mounting components provided by the press manufacturer such as coupling rods or clamping systems.

A method in accordance with the present invention enables one to create a spot coating relief raised surface for any type of carrier material and any type of printing press, for reproducing any shape or design with pinpoint accuracy to the exact location of the printed design. Because an image or pattern is generated in the carrier web only after the attachment thereof to the printing or blanket cylinder, the effects of distortion due to tension are eliminated. The tension is automatically compensated because the blanket is cut while under essentially the same tension extant during the printing or coating process.

Where the cutting cylinder is part of a dedicated unit, there is no problem implementing the invention with pre-existing printing presses. Where the cutting is to be performed on a blanket or printing cylinder, an apparatus in accordance with the present invention may be retrofitted to coating or printing stations of existing printing presses. An interface may be established with the prepress department or desk-top publisher to generate the data necessary to control the cutting device to form the raised image surfaces on the printing blanket or carrier material for providing the desired spot coating.

A method in accordance with the present invention eliminates the complex calculations otherwise required to compensate for distortion factors when preparing for spot coating applications. In response to data generated, for example, by desk-top publishing, the cutting device will automatically cut on press or in a dedicated unit, under the control of the computer, a raised image surface on the carrier material or printing blanket which will be in perfect registration and alignment with the printed shape or design.

A method in accordance with the present invention eliminates the need for toxic developers which are conventionally used to remove non-imaging, unexposed areas from a photopolymer compound layer of a printing plate.

A method and apparatus in accordance with the present invention will provide accurate and consistent raised image surfaces on a carrier material, directly on the printing cylinder of a printing press.

In accordance with the present invention, another, related, method used in printing comprises providing, in an electronic memory, an electrically encoded image to be transferred to a printing substrate during a printing process, disposing a flexible carrier web on a cutting surface, and placing tension on the carrier web substantially equal to tension the carrier would experience when attached to a blanket or printing cylinder of a printing machine. The cutting surface is different from any surface of the blanket or printing cylinder. For example, the cutting surface may be an outer surface of a dedicated or stand-alone cylinder. Alternatively, the surface may be a flat surface. After disposition of the carrier web on the cutting surface and after placement of tension on the carrier web, the carrier web is automatically cut in accordance with the electrically encoded image. At least one section of the carrier web is removed along cut lines made in the carrier web during the cutting thereof. The cut carrier web, with the section removed therefrom, is used on the blanket or printing cylinder of the printing machine to transfer an ink or coating composition to the printing substrate.

Where the cutting surface is a flat surface, the method further comprises removing the cut carrier web from the cutting surface, fastening the cut carrier web under essentially the same tension to the blanket or printing cylinder of the printing machine, and after the fastening, operating the machine to transfer the ink or coating composition to the printing substrate.

As discussed above, the cutting of the carrier web generally includes automatically operating a cutting device such as a laser cutter or a blade and further includes operating a computer to change a positioning of the cutting device relative to the carrier web, the computer being operatively connected to the memory. The cutting of the carrier web may also include operating the computer to change a positioning of the cutting surface. The flat surface holding the carrier web may be translated in two orthogonal axes independently.

BRIEF DESCRIPTION OF THE DRAWING

FIG. 1 is a diagram of an offset printing press modifiable to be a cutting apparatus in accordance with the present invention.

FIG. 2 is a schematic perspective view of cutter componentry included in the printing press of FIG. 1.

FIG. 3 is a schematic perspective view of a printing blanket or dual-layer carrier material, showing a printing blanket with an outer layer having removable sections.

FIG. 4 is partially a block diagram and partially a side elevational view of a modification of the printing press of FIG. 1, incorporating apparatus in accordance with the present invention.

FIG. 5 is a block diagram showing elements of a laser cutting system used in a method in accordance with the present invention.

FIG. 6 is a schematic perspective view of a dedicated cutting cylinder in accordance with the present invention.

FIG. 7 is partially a schematic end elevational view of the dedicated cutting cylinder of FIG. 6 and partially a block diagram.

FIG. 8 is a schematic end elevational view similar to FIG. 7, showing an alternative embodiment of a dedicated cutting cylinder in accordance with the present invention.

FIG. 9 is a schematic partial perspective view of a dedicated cutting cylinder according to the embodiments of FIG. 7 or 8, showing a modification of the invention.

FIG. 10 is a schematic partial longitudinal cross-sectional view of a another dedicated cutting cylinder in accordance with the present invention.

DETAILED DESCRIPTION

Figures 11, 12:
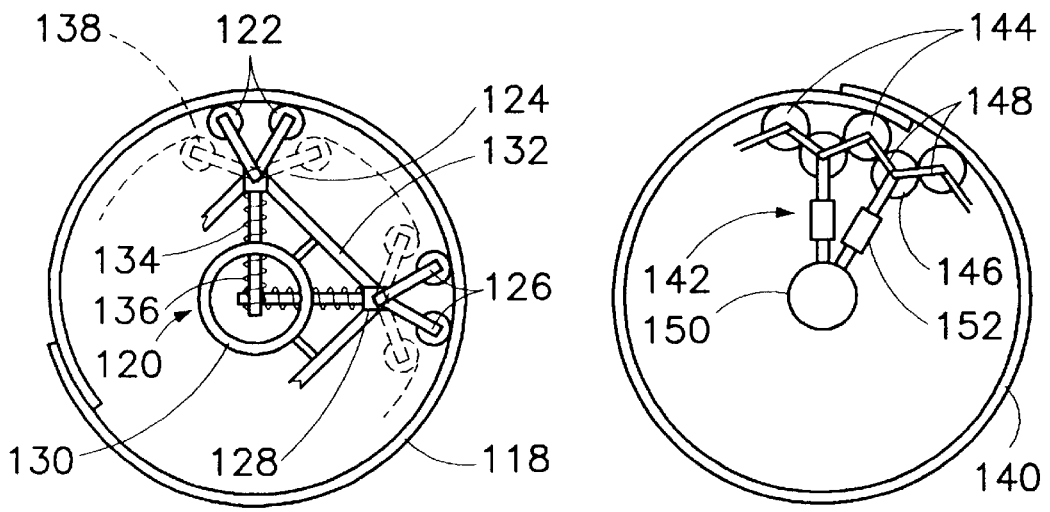
FIG. 11 is a schematic end elevational view of another dedicated cutting cylinder in accordance with the present invention.
FIG. 12 is a schematic end elevational view of a further dedicated cutting cylinder in accordance with the present invention.

As illustrated in FIG. 1, an offset printing press machine includes a plate cylinder 10, a blanket cylinder or roller 12, and an impression cylinder 14. Matter to be reproduced is copied photographically onto a metal plate or plates (not shown) which can be formed by direct imaging, for example, by a filmless laser imaging process which creates a slightly recessed image area. The metal plate or plates are disposed on plate cylinder 10. The metal plate or plates on cylinder 10 are inked and rotated with the plate cylinder to make an imprint of the text or illustration on a rubber layer 16 disposed on blanket cylinder 12.

Rubber layer 16 is an outer or upper layer of a dual layer printing blanket or carrier 18. Rubber layer 16 is attached to an underlying inner layer 20 made of fabric material. Printing blanket 18 is attached under tension to a cylindrical outer surface of blanket cylinder 12 via a pair or rods 22 attached to free ends of the printing blanket.

Blanket or printing cylinder 12 is rotated via a rotary drive 24 to print on sheets of paper (not shown) which are automatically fed to the printing press. Impression cylinder 14 serves to provide back-pressure to squeeze the paper sheets to the rubber-covered blanket cylinder 12 for transferring ink or coating to the substrate for final reproduction.

A coater apparatus 26 attached to a deck area (not designated) of the printing press includes a pick-up roller 28 for collecting a coating composition from a coating pan 30. The coating composition is transferred from pick-up roller 28 to rubber layer 16 of printing blanket 18 via an applicator roller 32. Coater apparatus 26 further includes a metering roller 33 and is generally totally retractable when not in service. When a job requires coating, coater apparatus 26 is shifted into direct contact with rubber-covered blanket cylinder 12 while plate cylinder 10 is not operable to transfer ink images to rubber layer 16. It is to be noted that a coater apparatus may include only one or two rollers instead of three. It can be a non-retractable dedicated coater apparatus such as a TOWER™ coater manufactured by Mann Roland.

As further illustrated in FIG. 1, an electronic memory 34 is provided for storing electrically encoded image or pattern information. That information defines an image, pattern or graphic design to be transferred to a printing substrate by blanket cylinder or roller 12. The image may be defined on the printing substrate by ink or by a clear coating, for example, during spot or patent coating application in an offset printing process.

A cutter 36 such as a laser source, a blade, a saw or a drill, is mounted to a carriage 38 in proximity to blanket cylinder 12 for cutting outer, rubber layer 16 of printing blanket 18. Carriage 38 is linearly shiftable along tracks 40 which extend axially relative to blanket cylinder 12, i.e., parallel to cylinder 12. One or more micrometers (not shown) may be provided on carriage 38 for enabling an accurate adjustment in the depth of cutting where the cutting is performed, for instance, by a knife, drill or saw.

FIG. 2 shows blanket cylinder 12, printing blanket 18, and carriage 38. In addition, cutter 36 is shown as a laser which generates a cutting beam 42. A controller 44 realizable as a computer or microprocessor is operatively connected to memory 34 (FIG. 1) and cutter 36 for controlling the cutter to form, in rubber layer 16, continuous curvilinear cuts 46 which define (possibly with outer edges of blanket 18) removable closed forms 48 in layer 16 in accordance with the image or pattern information stored in memory 34. Closed forms 48 of rubber layer 16 are removed after the formation of cuts 46 and prior to a coating process wherein a coating composition is transferred from coating pan 30 to raised portions of printing blanket 18 (unremoved portions of outer, rubber layer 16) via pick-up roller 28 and applicator roller 32.

Computer controller 44 is connected to a linear drive 50 which moves carriage 38 along tracks 40. The direction and rate of movement of carriage 38 is determined by computer controller 44 in accordance with the image or pattern information stored in memory 34 and the rate of rotation of blanket cylinder 12 during the cutting operation. Computer controller 44 may also be connected to a rotary drive 24 for controlling the angular speed and direction of rotation of blanket cylinder 12. The computer controller 44 obtains feedback as to the angular position and angular velocity of cylinder 12 via an angular encoder 52.

Thus, it is apparent from the foregoing that computer controller 44 coordinates the energization or operation of cutter 36, the movement of carriage 38, the rotation of blanket cylinder 12 to form a pattern or design in outer, rubber layer 16 only after the attachment of printing blanket 18 to cylinder 12 and the subjecting of blanket 18 to substantially all the distorting tensions it will experience during a coating procedure in an offset printing process.

As further illustrated in FIG. 1, an optical scanner 54 such as a camera is connected to computer controller 44 and from thence to memory 34 for scanning a pre-existing image, for example, on paper, and generating signals encoding that image. Those signals or processed forms thereof are transmitted to memory 34 for storage therein. It is to be noted, that the pattern or image information in memory 34 may be generated by computer controller 44 or another computer (not shown) through the use of a graphics program.

As illustrated in FIG. 4, a laser source 56 may be disposed in a stationary location. A laser beam produced by laser source 56 is directed to a printing blanket 58 on a printing cylinder (not separately enumerated) by suitable optics 60 provided on a carriage 62. Carriage 62 is shiftable along a track 64 by a linear drive 66 in response to signals from a computer controller 68. Track 64 extends parallel to the printing cylinder which is rotatable by a rotary drive 70 under the control of computer controller 68.

Optics 60 may include a mirror 72, as well as collimating optics 74 and a lens 76, as depicted diagrammatically in FIG. 5.

In using the printing press apparatus of FIG. 1, an electrically encoded image, pattern or graphic design is stored in memory 34. The image or pattern data is generated by camera scanner 54 or by a graphics program. Prior to the formation of cuts 46, dual-layer offset printing blanket 18 is attached under tension to cylinder 12 of the offset printing machine. After attachment of printing blanket 18 to cylinder 12, outer layer 16 of blanket 18 is automatically cut in accordance with the electrically encoded image. Subsequently, sections 48 of outer layer 16 are removed along cut lines 46 made in the outer layer during the cutting thereof.

It is to be noted that ink or clear coating in a predetermined pattern may be transferred from blanket or printing cylinder 12 to a printing substrate via printing blanket 18 or another carrier web made of any flexible sheet material capable of holding ink or coating compositions and transferring the ink or coating compositions to a printing substrate during a printing process. As a specific example, a single, dual or multilayer printing blanket may be attached in part via an adhesive backing to a metal plate which is then mounted to blanket or printing cylinder 12. In that case, the sheet is cut through to an underlying metal surface, e.g., of the metal plate which is mounted to the blanket cylinder. In addition, blanket or printing cylinder 12 may be located at any position along an inline printing machine, whether for applying ink or clear coating to a printing substrate. In a multicolor press, there may be a plurality of blanket or printing cylinders carrying respective carrier webs cut in accordance with the invention as described herein.

The printing method described hereinabove may be modified by performing the cutting of the printing blanket or carrier web on a dedicated cutting cylinder rotatable in alternate directions in a stand-alone assembly (not separately illustrated) apart from the printing press. Such a stand alone assembly is identical in structure and operation to the hardware shown in FIG. 1, except that plate cylinder 10, impression cylinder 14, and coater apparatus 26 and their associated functions are omitted. Blanket cylinder 12 then functions solely as a cutting cylinder: it supports printing blanket or carrier 18 under tension during a cutting operation as described hereinabove with reference to FIGS. 1–5. After the cutting of the printing blanket or carrier web 18 is completed on the stand-alone assembly, the cut carrier web is transferred to blanket or printing cylinder of a printing press. Accordingly, the dedicated cutting cylinder in a stand-alone cutting assembly has the same dimensions as the blanket or printing cylinder to which the cut carrier web or printing blanket 18 is attached after cutting is completed. Sections of the carrier web are removed from the web along cut lines made in the web during the cutting thereof. The removal of these cut sections may be performed at any time after cutting and prior to printing, i.e., while the carrier web or printing blanket is disposed on the dedicated cutting cylinder, after the cut carrier web has been transferred to the blanket or printing cylinder or while the carrier web is free during transfer of the cut carrier web or printing blanket from the cutting cylinder to the printing cylinder.

Of course, the structure illustrated in FIG. 4 may be a stand-alone or dedicated cutting assembly. In any case, the tension applied to the carrier web on the dedicated cutting cylinder should be essentially the same as the tension applied to the cut carrier web when subsequently disposed on the blanket or printing cylinder.

It is to be understood that the terms "blanket cylinder" and "printing cylinder" are used interchangeably herein to denote a cylinder of a printing press which receives ink or coating from a plate cylinder or coating apparatus, respectively, and which transfers the ink or coating to a printing substrate such as a paper or cardboard sheet. It is to be further noted that the term "carrier web" as used herein is intended to denote any flexible sheet which is attachable to a blanket or printing cylinder and which is capable of holding ink or coating compositions and transferring the ink or coating compositions to a printing substrate during a printing process.

As illustrated in FIG. 6, a stand-alone or dedicated cutting cylinder 78 for use in a stand-along cutting assembly as described hereinabove with reference to FIGS. 1 and 4, is a cylinder of a variable or adjustable width or diameter d and of a fixed length l. Length l is longer than the length of any blanket cylinder 12. Thus, cylinder 78 can be used for cutting a printing blanket or carrier 18 regardless of the particular size of the blanket cylinder 12 to which the cut blanket is attached for carrying out a printing operation. More specifically, diameter d of dedicated cutting cylinder 78 is adjusted prior to a cutting operation so that the width of the cutting cylinder matches the width of the printing cylinder to which the cut blanket is mounted in a printing press.

As illustrated in FIGS. 6 and 7, cutting cylinder 78 is provided with a diameter control mechanism 80 including a plurality of hydraulic or pneumatic cylinders (or solenoids) 82 each operatively connected to a pressure source 84 via valves 86 actuated by a control unit 88. Control unit 88 has input (not shown) enabling a setting of diameter d by a human operator.

Cutting cylinder 78 is provided with a spring action in the form of rubber bands 90 which surround the cylinder and bias the cylinder inwardly into a contracted configuration of reduced diameter d. Hydraulic or pneumatic cylinders (or solenoids) 82 counteract the action of bands 90 and determine the exact setting for diameter d.

Longitudinally aligned groups of hydraulic or pneumatic cylinders (or solenoids) 82 may be connected at their radially outer ends to longitudinally extending bars 92 which are in slidable contact with an inner surface of cutting cylinder 78. Along their radially inner ends, hydraulic or pneumatic cylinders (or solenoids) 82 are fixed to a hub 94.

Cylinder 78 is formed of a piece of flexible sheet metal bent into an arcuate form and overlapping itself at 96. The cylindrical integrity of cylinder 78 is maintained by virtue of bars 92.

Cylinder 78 is rotated by rollers 98 which are biased by respective springs 100 into contact with an outer surface of cylinder 78. Rollers 98 each have a high-friction cylindrical driving surface and are powered by a non-illustrated drive.

FIG. 8 depicts an alternative diameter control mechanism for variable-diameter dedicated cutting cylinder 78, including a plurality of bladders 102 disposed between a hub 104 and cylinder 78. Instead of bands 90, internally mounted tension springs 103 are provided for biasing cylinder 78 into a contracted configuration of reduced diameter d. Bladders 102 are connected to pressure source 84 (FIG. 7) via valves 86. Control unit 88 (FIG. 7) is responsive to operator input to alternatively inflate or deflate bladders 102, thereby respectively increasing or decreasing the diameter of cylinder 78. The rotation of cylinder 78 is as described hereinabove with reference to FIG. 7.

Where elastic or rubber bands 90 are used to exert a radially inward biasing force on cylinder 78, grooves 106 may be provided in cylinder 78 for receiving bands 90, as depicted in FIG. 9.

FIG. 10 illustrates another diameter control mechanism for a variable-diameter dedicated cutting cylinder 108. Opposite ends (only one end shown) of cylinder 108 are provided with an external helical screw threads 110 matingly meshing with internal screw threads 112 on respective rotatable sleeves 114. Cylinder 108 is slotted at 116 and is formed with an internal spring bias tending to open the cylinder into an expanded configuration of increased diameter D. Sleeves 114 exert a restraining force on the expansion of cylinder 108 to maintain the cylinder at a predetermined diameter D. Rotating sleeves 114 relative to cylinder 108 changes the diameter D of the cylinder 108. During a cutting operation, sleeves 114 and cylinder 108 are rotated at the same angular velocity, thereby staying stationary relative to one another.

FIG. 11 depicts another stand-alone or dedicated cylinder 118 which is provided with a diameter control assembly 120 for enabling the preparation of cut printing blankets for use with printing cylinders of different dimensions. Diameter control assembly 120 comprises a plurality of pairs of rollers 122 disposed in contact with an inner surface of cylinder 118. Each roller 122 is joined to the other member of the respective pair by a scissors mechanism 124. The scissors mechanism 124 includes a pair of arms 126 pivotably mounted to a base 128 in turn rigidly secured to a hub 130 of cylinder 118 by a support structure 132. Scissor arms 126 are pivoted by rotation of a knurled shaft 134 which extends radially from hub 130.

Shafts 134 are each drivably connected to a worm-thread shaft 136 disposed inside hub 130. Rotation of worm-thread shaft 136 turns shafts 134 which in turn pivot scissor arms 126 alternately towards or away from one another, thereby modifying cylinder 118 to alternately assume a large-diameter configuration (solid lines) or a smaller-diameter configuration (dashed lines 138). As in other embodiments of an adjustable-diameter dedicated cutting cylinder disclosed herein, cylinder 118 is spring-biased towards a small diameter, owing either to internal spring forces or to compressive forces exerted by external elements such as bands 90.

In a modification of the stand-alone or dedicated cylinder 118 of FIG. 11, bases 128 are not fastened to hub 130 but rather ride along their respective knurled shafts 134 in response to a rotation thereof. The same rotation causes arms 126 to pivot. In this modification, arms 126 of a connected pair can be pivoted towards one another as the respective base 128 moves radially inwardly and away from one another as the base moves radially outwardly, thereby enabling an even or equispaced distribution of the rollers 122 along the circumference of cylinder 118. Alternatively, instead of a positive mechanical linkage between arms 126 and their respective knurled shafts 134, the members of each pair of scissor arms 126 may be engaged by legs of a Y-shaped coil spring (not illustrated) disposed in the respective base 128, whereby the spacing of those members from one another increases with increasing radius or distance from hub 130 owing to the increased compressive force exerted by cylinder 118.

As shown in FIG. 12, another stand-alone or dedicated cylinder 140 is provided with a diameter control assembly 142 including a plurality of outer rollers 144 and a plurality of inner rollers 146 joined to each other by at least one series of circumferentially disposed dog-bone links 148. Inner rollers 146 are connected at their hubs to a hub 150 of cylinder 140 via respective extender elements 152. Extender elements 152 may be pneumatic or hydraulic cylinders, solenoids, or externally threaded shafts screwingly mating with internally threaded sockets (none shown). In order to diametrically distend cylinder 140, radially outward pressure is applied to the inner rollers 146 by extender elements 152 to force outer rollers 144 radially outward and simultaneously separate the outer rollers from each other in the circumferential direction, thus advantageously maintaining the uniformity of internal support points of cylinder 140.

As an alternative to elastic bands 90 in FIG. 6, cylinder 78 may take the form of a hardened metal shell with a memory. The shell has a relaxed configuration with the minimum required diameter. The maximum required diameter is within the practical elastic limit of the material. Such a shell will act as a cylindrical spring over many deformation cycles and thus obviate the need for external compressive elements such as bands 90.

Figure 13:
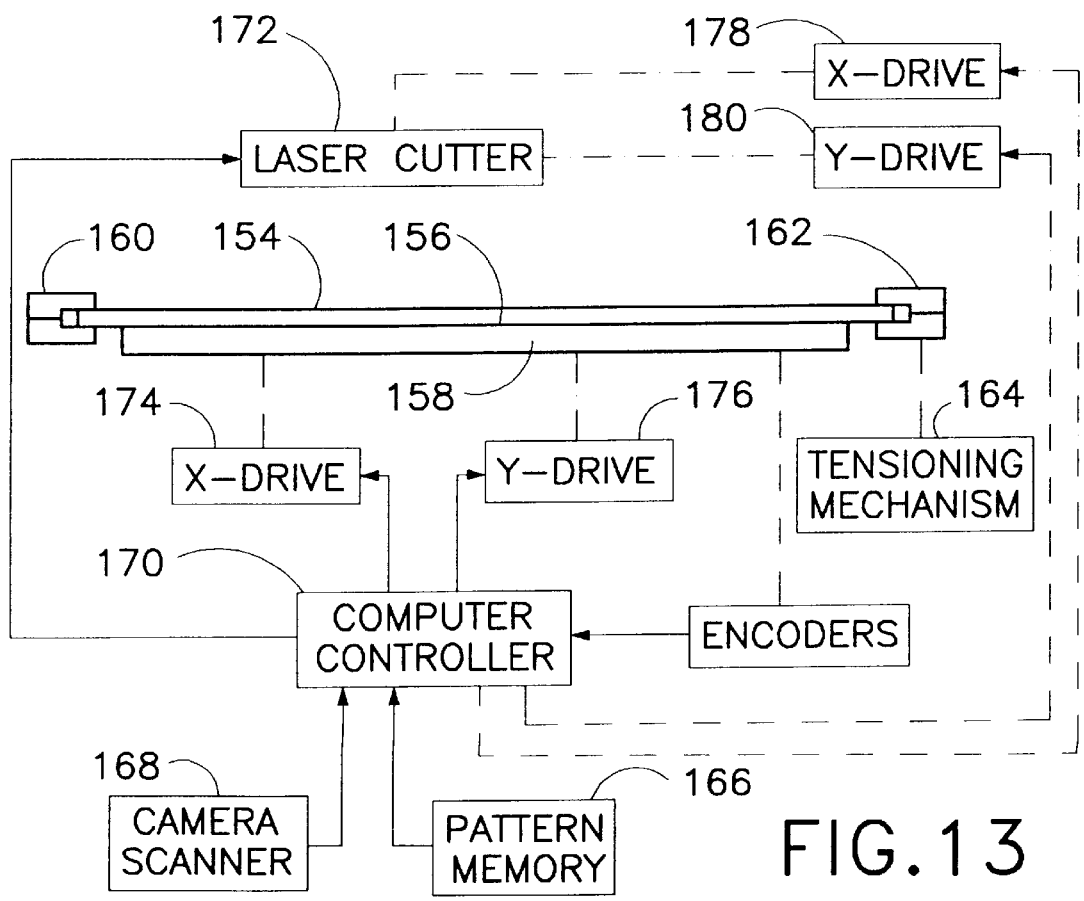
FIG. 13 is partially a schematic side view and partially a block diagram of a cutting system used in a method in accordance with the present invention.

As illustrated in FIG. 13, cutting of a printing blanket or, more generally, a flexible carrier web 154 is effectuated by disposing the web on a cutting surface 156 such as a flat upper surface of a dedicated or stand-alone support plate 158. Opposite ends of carrier web 154 are gripped by clamps 160 and 162. One clamp 160 may be stationary, while the other clamp 162 is operatively connected to or an integral part of a tensioning mechanism 164 such as a rack which is operative to place a predetermined degree of tension on carrier web 154. This predetermined tension is equal to the tension the carrier web 154 experiences when attached to a blanket or printing cylinder of a printing machine in a subsequent printing process.

After disposition of carrier web 154 on cutting surface 156 and after placement of tension on the carrier web, the carrier web is automatically cut in accordance with an electrically encoded image stored in an electronic pattern memory 166 or produced by a camera scanner 168. At least one section of carrier web 154 is removed along cut lines made in the carrier web during the cutting thereof. The cut carrier web, with the section removed therefrom, is used on the blanket or printing cylinder of the printing machine to transfer an ink or coating composition to the printing substrate.

The cut carrier web 154 is removed from cutting surface 156 and fastened to the blanket or printing cylinder of the printing machine under essentially the same tension as exerted on the carrier web during the cutting process. After the fastening of web 154 to the blanket or printing cylinder, the printing machine is operated to transfer the ink or coating composition to the printing substrate.

Carrier web 154 is automatically cut by a computer controller 170 which receives the electrically encoded image or pattern from memory 166 or scanner 168 and which operates a cutting device such as a laser cutter 172. More specifically, computer controller 170 determines whether laser cutter 172 is energized to emit a laser beam. Computer controller 170 is operatively connected to a pair of linear drives 174 and 176 which in turn are operatively coupled to support plate 158 for shifting the support plate independently along an x axis and a y axis orthogonal thereto to thereby change a position of laser cutter 172 relative to carrier web 154. Alternatively or additionally, computer controller 170 is operatively connected to an x-axis drive 178 and a y-axis drive 180 which are operatively coupled to laser cutter 172 for shifting the cutter relative to support plate 158 and concomitantly relative to carrier web 154 supported thereby.

As discussed above, micrometer adjustments may be made to the cutting device, for example, to a z-axis position of support plate 158, to control depth of cutting of carrier web 154.

Where carrier web 154 is a dual-layer printing blanket, the cutting thereof includes the step of cutting essentially only an outer layer of the carrier web, the removed sections of the carrier web being of the outer layer. The printing process, once the web has been cut and attached to a blanket or printing roller, is described above.

Although the invention has been described in terms of particular embodiments and applications, one of ordinary skill in the art, in light of this teaching, can generate additional embodiments and modifications without departing from the spirit of or exceeding the scope of the claimed invention. For example, other techniques for adjusting the diameter of a cylinder will be apparent to those of ordinary skill in the art. In addition, the support surface for the carrier web during cutting operations may take any form between a flat surface and a cylindrical surface. Also, other techniques for exerting tension on a printing blanker or carrier web will be available to those skilled in the art.

Accordingly, it is to be understood that the drawings and descriptions herein are proferred by way of example to facilitate comprehension of the invention and should not be construed to limit the scope thereof.

What is claimed is:

1. A printing method comprising:
   providing, in an electronic memory, an electrically encoded image to be transferred to a printing substrate during a printing process;
   providing a rotatably mounted cutting cylinder having an adjustable diameter and a length at least as long as a length of a blanket or printing cylinder of a printing machine;
   adjusting the diameter of said cutting cylinder to be equal to a diameter of said blanket or printing cylinder;
   after adjusting of the diameter of said cutting cylinder, attaching a flexible carrier web under tension to said cutting cylinder;
   after attachment of said carrier web to said cutting cylinder, automatically cutting said carrier web in accordance with said electrically encoded image; and
   using the cut carrier web on the blanket or printing cylinder of the printing machine to transfer an ink or coating composition to the printing substrate.

2. The method defined in claim 1 wherein said cutting cylinder is separate from said printing machine and wherein using the cut carrier web to transfer an ink or coating composition to the printing substrate includes:
   detaching the cut carrier web from said cutting cylinder;
   fastening the cut carrier web under essentially the same tension to said blanket or printing cylinder of said printing machine; and
   after said fastening, operating said machine to transfer the ink or coating composition to the printing substrate.

3. The method defined in claim 2 wherein the cutting of said carrier web includes automatically operating a cutting device.

4. The method defined in claim 3 wherein the cutting of said carrier web includes operating a computer to change a positioning of said cutting device relative to said carrier web, said computer being operatively connected to said memory.

5. The method defined in claim 4 wherein the cutting of said carrier web also includes operating said computer to change an angular positioning of said cutting cylinder.

6. The method defined in claim 3 wherein said cutting device is a laser cutting device and the operating of said laser cutting device includes operating a computer to control energization of said laser cutting device, said computer being operatively connected to said memory.

7. The method defined in claim 3, further comprising the step of making micrometer adjustments to said cutting device to control depth of cutting of said carrier web.

8. The method defined in claim 2 wherein said carrier web is a dual-layer printing blanket, said cutting including the step of cutting essentially only an outer layer of said carrier web.

9. The method defined in claim 2 wherein the step of providing said electrically encoded image includes:
   scanning a pre-existing image;
   thereafter converting said pre-existing image into electrical signals; and
   storing said electrical signals.

10. The method defined in claim 9 wherein said scanning includes optically scanning.

11. The method defined in claim 2 wherein the cutting of said carrier web includes forming essentially only continuous curvilinear cuts in said carrier web.

12. The method defined in claim 11 wherein said cuts and outer edges of said carrier web essentially define only closed sections in said carrier web.

13. The method defined in claim 2, further comprising (a) shifting a coating device into contact with raised portions of said carrier web after fastening the cut carrier web to said blanket or printing cylinder and (b) operating said coating device to provide a spot coating image on said carrier web, a plate cylinder of said printing machine being inoperative to transfer ink images to the carrier web during the operation of said coating device to provide a spot coating on said carrier web.

14. The method defined in claim 2 wherein said step of attaching includes coupling said carrier web to a metal plate via an adhesive layer and subsequently attaching said metal plate with said carrier web to said cutting cylinder, the detaching of the cut carrier web from said cutting cylinder including detaching said carrier web with said metal plate, the fastening of the cut carrier web to said blanket or printing cylinder including fastening said carrier web with said metal plate to said blanket or printing cylinder.

15. The method defined in claim 1 wherein the cutting of said carrier web includes automatically operating a cutting device.

16. The method defined in claim 1 wherein said carrier web is a dual-layer carrier web, said cutting including the step of cutting essentially only an outer layer of said carrier web.

17. The method defined in claim 1 wherein the step of providing said electrically encoded image includes:
    scanning a pre-existing image;
    thereafter converting said pre-existing image into electrical signals; and
    storing said electrical signals.

18. An apparatus used in printing, comprising:
    a memory for storing an electrically encoded image to be transferred to a printing substrate during a printing process;
    a rotatable cylinder having an adjustable diameter;
    coupling elements on said cylinder for removably attaching a carrier web under tension to said cylinder;
    a cutting device for forming continuous curvilinear cuts in said carrier web attached to said cylinder; and
    a controller operatively connected to said memory and said cutting device for controlling said cutting device to form, in said carrier web in accordance with said electrically encoded image, continuous curvilinear cuts in said carrier web.

19. The apparatus defined in claim 18 wherein said controller includes a computer programmed to control said cutting device to form continuous curvilinear cuts in said carrier web in accordance with said electrically encoded image.

20. The apparatus defined in claim 18 wherein said cutting device further includes positioning components operatively for positioning the cutting relative to said cylinder, said computer being operatively connected to said positioning components for controlling the operation thereof.

21. A method used in printing, comprising:
    providing, in an electronic memory, an electrically encoded image to be transferred to a printing substrate during a printing process;

disposing a flexible carrier web on a cutting surface;

placing tension on said carrier web substantially equal to tension said carrier web would experience when attached to a blanket or printing cylinder of a printing machine, said cutting surface being different from any surface of said blanket or printing cylinder;

after disposition of said carrier web on said cutting surface and after placement of tension on said carrier web, automatically cutting said carrier web in accordance with said electrically encoded image;

removing at least one section of said carrier web along cut lines made in said carrier web during the cutting thereof; and using the cut carrier web, with the section removed therefrom, on the blanket or printing cylinder of the printing machine to transfer an ink or coating composition to the printing substrate.

22. The method defined in claim 21 wherein said cutting surface is a flat surface, further comprising:

removing the cut carrier web from said cutting surface;

fastening the cut carrier web under essentially the same tension to said blanket or printing cylinder of said printing machine; and after said fastening, operating said machine to transfer the ink or coating composition to the printing substrate.

23. The method defined in claim 22 wherein the cutting of said carrier web includes automatically operating a cutting device.

24. The method defined in claim 23 wherein the cutting of said carrier web includes operating a computer to change a positioning of said cutting device relative to said carrier web, said computer being operatively connected to said memory.

25. The method defined in claim 24 wherein the cutting of said carrier web also includes operating said computer to change a positioning of said cutting surface.

26. The method defined in claim 23 wherein said cutting device is a laser cutting device and the operating of said laser cutting device includes operating a computer to control energization of said laser cutting device, said computer being operatively connected to said memory.

27. The method defined in claim 23, further comprising the step of making micrometer adjustments to said cutting device to control depth of cutting of said carrier web.

28. The method defined in claim 22 wherein said carrier web is a dual-layer printing blanket, said cutting including the step of cutting essentially only an outer layer of said carrier web, the removed sections of said carrier web being of said outer layer.

29. The method defined in claim 22 wherein the step of providing said electrically encoded image includes:

scanning a pre-existing image;

thereafter converting said pre-existing image into electrical signals; and storing said electrical signals.

30. The method defined in claim 29 wherein said scanning includes optically scanning.

31. The method defined in claim 22 wherein each of said cut lines is an essentially continuous curvilinear cut in said carrier web, the cutting of said carrier web including forming essentially only continuous curvilinear cuts in said carrier web.

32. The method defined in claim 31 wherein said cut lines and outer edges of said carrier web essentially define only closed sections in said carrier web.

33. The method defined in claim 22, further comprising (a) shifting a coating device into contact with raised portions of said carrier web after fastening the cut carrier web to said blanket or printing cylinder and (b) operating said coating device to provide a spot coating image on said carrier web, a plate cylinder of said printing machine being inoperative to transfer ink images to the carrier web during the operation of said coating device to provide a spot coating on said carrier web.

34. The method defined in claim 22 wherein said step of disposing includes coupling said carrier web to a metal plate via an adhesive layer and subsequently attaching said metal plate with said carrier web to said cutting surface, the removing of the cut carrier web from said cutting surface including detaching said carrier web with said metal plate, the fastening of the cut carrier web to said blanket or printing cylinder including fastening said carrier web with said metal plate to said blanket or printing cylinder.

35. An apparatus used in printing, comprising:

a memory for storing an electrically encoded image to be transferred to a printing substrate during a printing process;

a substantially flat support surface having at least two pairs of opposing edges;

coupling elements for releasably placing a carrier web disposed on said surface under tension;

a cutting device for forming continuous curvilinear cuts in said carrier web disposed under tension on said support surface; and a controller operatively connected to said memory and said cutting device for controlling said cutting device to form, in said carrier web in accordance with said electrically encoded image, continuous curvilinear cuts in said carrier web.

36. The apparatus defined in claim 35 wherein said controller includes a computer programmed to control said cutting device to form continuous curvilinear cuts in said carrier web in accordance with said electrically encoded image.

37. The apparatus defined in claim 35 wherein said cutting device further includes positioning components operatively for positioning the cutting relative to said support surface, said computer being operatively connected to said positioning components for controlling the operation thereof.

\* \* \* \* \*